United States Patent [19]
Davis et al.

[11] Patent Number: 6,100,730
[45] Date of Patent: Aug. 8, 2000

[54] PRESCALER SYSTEM CIRCUITS

[75] Inventors: Darrell Eugene Davis, Sunrise; Scott Robert Humphreys, Boynton Beach, both of Fla.

[73] Assignee: Motorola, Schaumburg, Ill.

[21] Appl. No.: 09/201,015

[22] Filed: Nov. 30, 1998

[51] Int. Cl.[7] .................................................. H03B 19/00
[52] U.S. Cl. ......................... 327/117; 327/208; 327/210; 327/211; 327/212
[58] Field of Search ................................. 327/117, 200, 327/202, 203, 208, 209, 210, 211, 212, 218; 326/93, 95, 98

[56] References Cited

U.S. PATENT DOCUMENTS

| | | | |
|---|---|---|---|
| 4,057,741 | 11/1977 | Piguet | 327/211 |
| 4,953,187 | 8/1990 | Herold et al. | 377/48 |
| 4,991,187 | 2/1991 | Herold et al. | 377/48 |
| 5,321,399 | 6/1994 | Notani et al. | 341/100 |
| 5,592,114 | 1/1997 | Wu et al. | 327/208 |
| 5,828,249 | 10/1998 | Sessions | 327/115 |

OTHER PUBLICATIONS

Huang and Rogenmoser, *Speed Optimization of Edge–Triggered CMOS Circuits for Gigahertz Single–Phase Clocks*, IEEE Journal of Solid State Circuits, vol. 31, No. 3, Mar. 1996, pp. 456–465.

*Primary Examiner*—Timothy P. Callahan
*Assistant Examiner*—Hai L. Nguyen
*Attorney, Agent, or Firm*—Pablo Meles

[57] ABSTRACT

A prescaler system (100) has a prescaler circuit (102) coupled to a divider (104), wherein the divider includes an improved dynamic flip flop divider (118). The divider (118) includes a TSPC nine-transistor D-flip-flop (10). The divider further includes a tenth transistor such as N channel device (41) having a source coupled to ground (43), a drain coupled to a junction between a drain of a P channel device (34) and a drain of another N channel device (37). The divider also includes an eleventh transistor such as N channel device (42) having a source coupled to ground and a drain coupled to a junction between the drain of a P channel device (35) and the drain of a N channel device (39), the junction providing a feedback signal to a N channel device (36), wherein the eleventh transistor further has a gate coupled to the output signal ($/Q_A$).

6 Claims, 6 Drawing Sheets

PRESCALER SYSTEM CIRCUITS

FIELD OF THE INVENTION

The present invention is directed to logic circuits, and more particularly to a CMOS prescaler system suitable for integration into integrated circuits for use with portable communication products.

BACKGROUND OF THE INVENTION

Optimizing a digital circuit at a transistor level may often be more difficult than optimizing an analog circuit because of the electrical parameters of a MOS or CMOS transistor such as gate capacitance and drain current which depend strongly on a transistor's terminal voltages and which in turn change rapidly with time in a digital circuit. Further, a particular charging or discharging path and the various load capacitances may look very different for different logic states that the circuit may be in. Current prescaler systems may have dynamic flip flops in dividers that fail to provide a usable output signal that will drive a subsequent stage, particularly at environmental and process extremes. Current prescaler systems may also have prescaler circuits that require additional drive from a buffer amplifier and represent additional parasitic capacitance within the prescaler circuit that prevents the prescaler circuit from operating at higher frequencies. Thus, a need exists for divider circuits and prescaler circuits within a prescaler system that can operate at environmental extremes and at higher frequencies (and/or broader frequency ranges) and that further overcome the problems described above.

2

Figure 14:
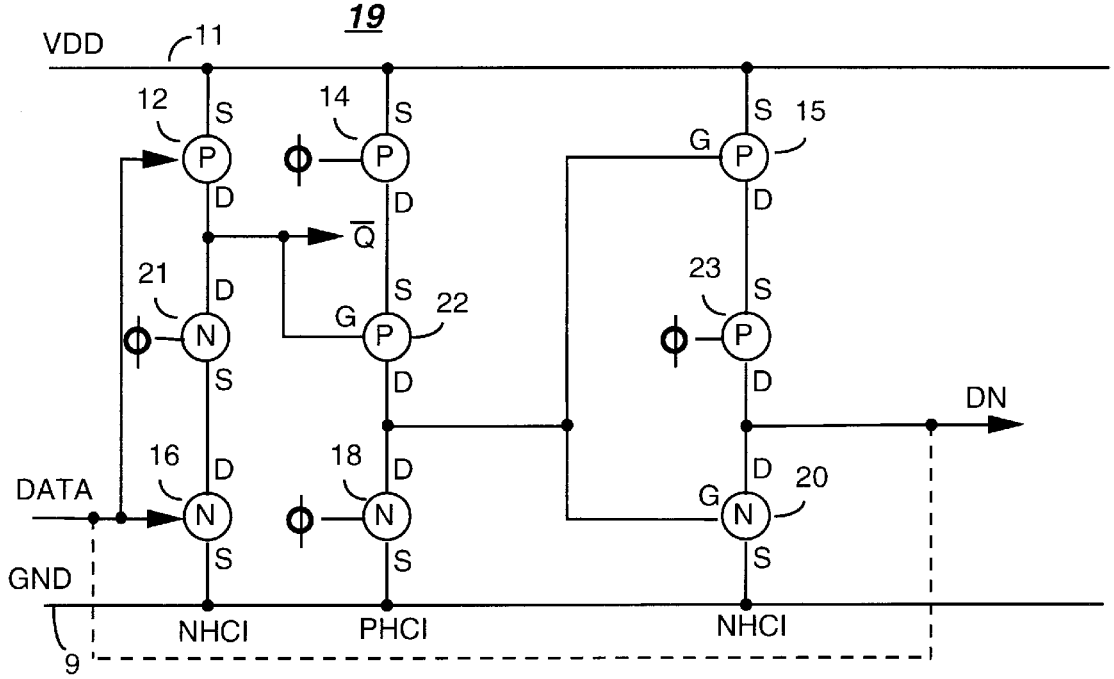
FIG. 14 is a schematic diagram of another TSPC nine-transistor D-flip-flop of similar to the flip flop of FIG. 12 with interchanged p and n channel devices.
Figure 15:
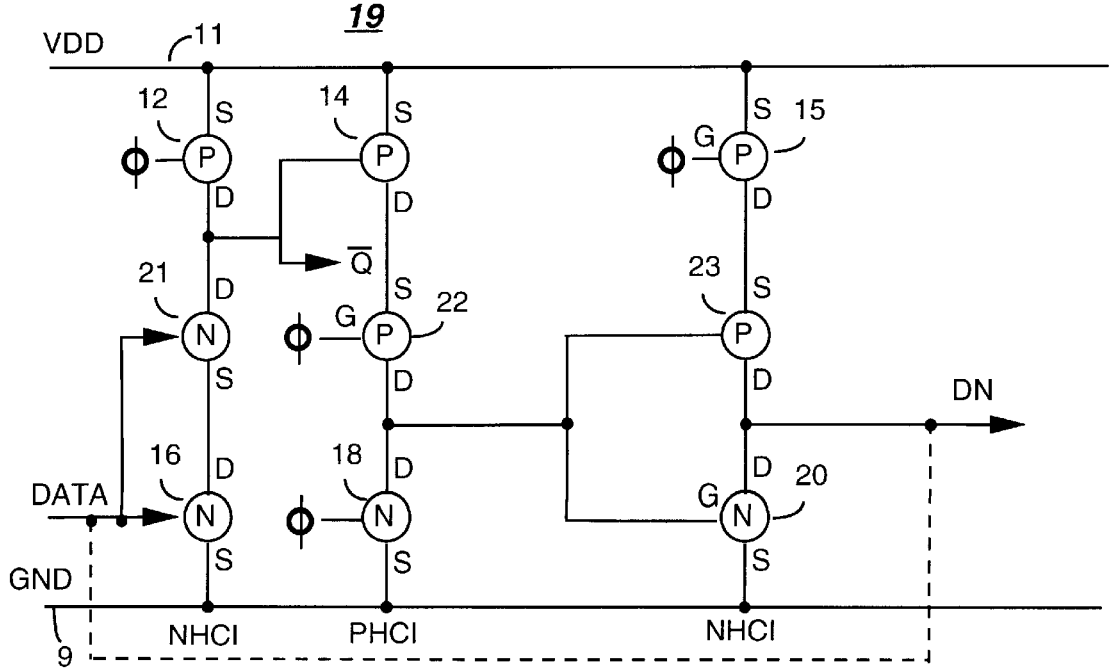

FIG. 15 is a schematic diagram of the TSPC nine-transistor D-flip-flop of FIG. 14 with interchanged inputs.

Figure 16:
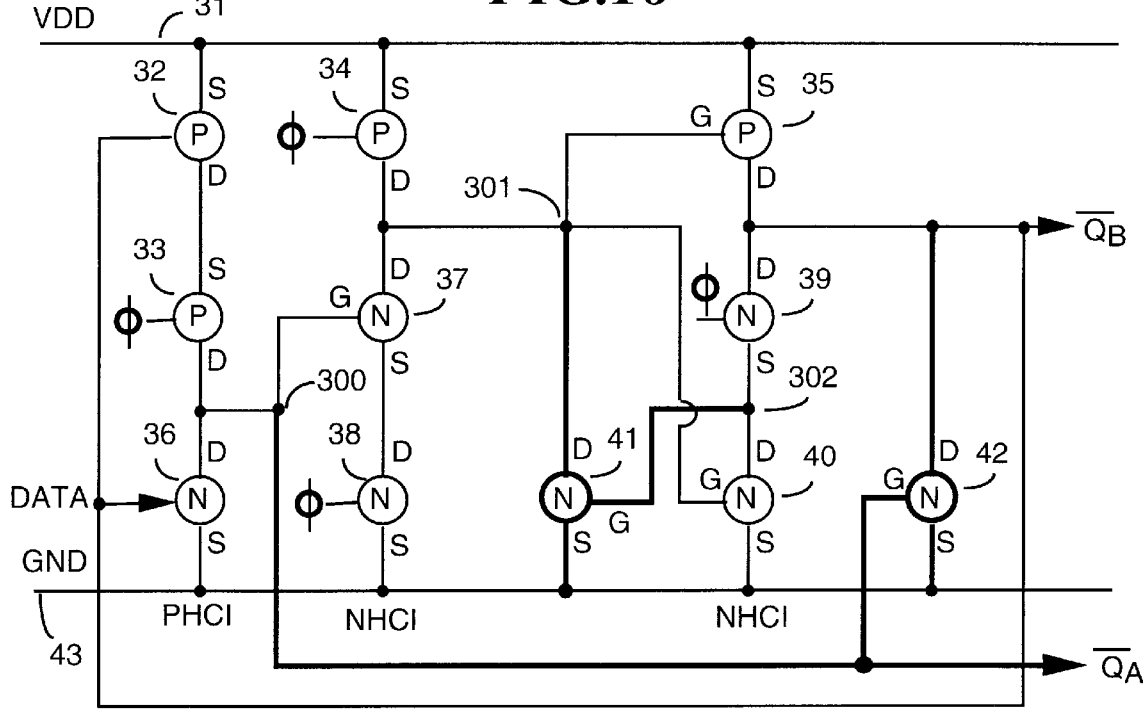

FIG. 16 is a schematic diagram of an improved dynamic flip flop divider in accordance with the present invention.

Figure 17:
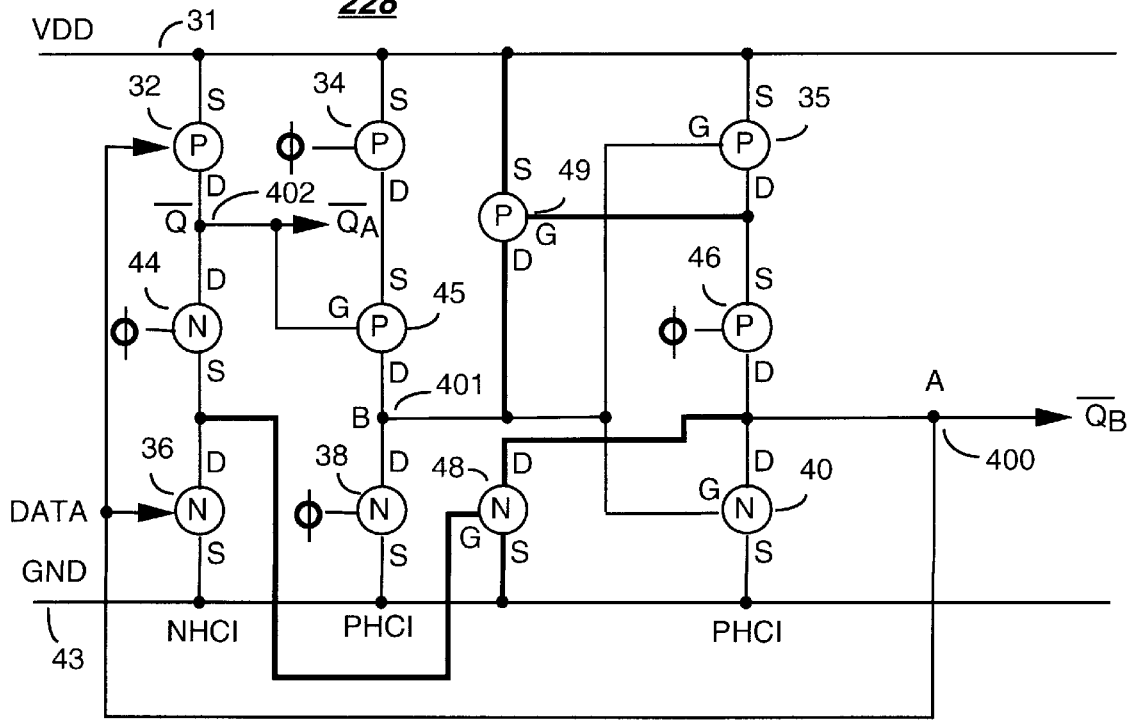

FIG. 17 is a schematic diagram of another improved dynamic flip flop divider in accordance with the present invention.

DESCRIPTION OF A PREFERRED EMBODIMENT

Figure 1:
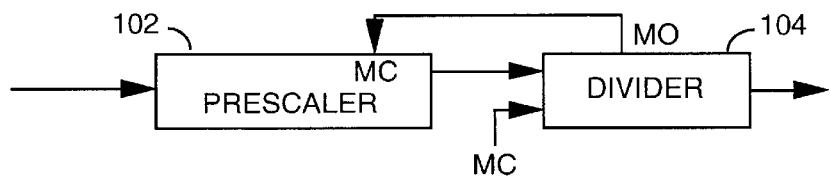
FIG. 1 is a block diagram of a prescaler system in accordance with the present invention.
Figure 2:
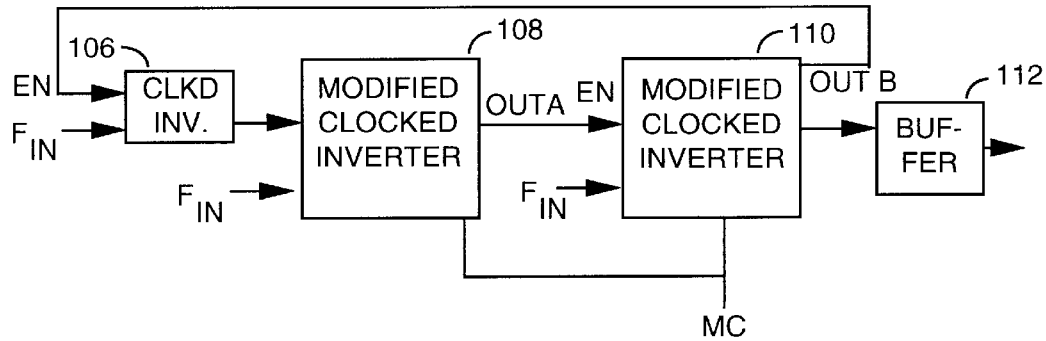
FIG. 2 is a block diagram of a prescaler circuit in accordance with the present invention.
Figure 3:
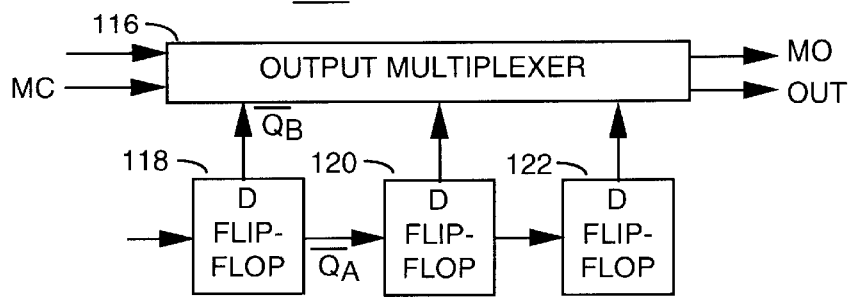
FIG. 3 is a block diagram of a divider circuit in accordance with the present invention.

Referring to FIG. 1, a prescaler system 100 has a prescaler circuit 102 coupled to a divider 104 wherein a control signal (MC) is provided to the divider 104 and an output (MO) from the divider is fed back to the prescaler circuit 102 as a control signal. Preferably, a prescaler circuit 102 as shown in FIG. 2 comprises a clocked inverter 106 coupled to a first modified clocked inverter 108 which is coupled to a second modified clocked inverter 110. The clocked inverter 106 typically comprises a basic dynamic clocked converter having a pair P channel devices and a pair of N channel devices coupled in series as will become further evident with the descriptions of FIGS. 5 and 7. The output from the second modified clocked inverter 110 is provided to a buffer 112. Preferably the divider 104 as shown in FIG. 3 comprises a series of D flip flops (118, 120, and 122) coupled to an output multiplexer 116.

Figure 4:
FIG. 4 is a schematic diagram of an existing gated clocked inverter used in a prescaler circuit.
Figure 4:
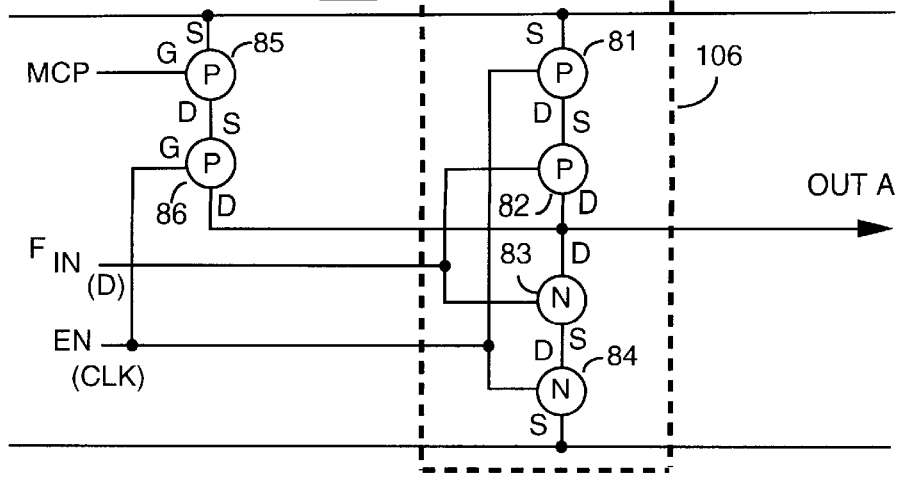

Referring to FIG. 4, there is shown an existing gated clocked inverter 107 used in current prescaler circuits. Gated clocked inverter 107 has additional complexity and parasitic capacitance that limits the circuit from operating at a maximum frequency. Gated clocked inverter 107 is gated by the "MCP" signal through P channel devices 85 and 86. P channel device 86 has its gate connected to the line "EN" which would preferably be driven by a previous stage such as a clocked inverter like device 106 of FIG. 2. The loading that the inverter 107 presents to the previous stage or clock signal ($F_{IN}$) is a limiting factor to the maximum operating frequency of the prescaler circuit 102. Further details of the inverter 107 with the interconnections between P channel devices 81 and 82 and N channel devices 83 and 84 shall become apparent from the description below of the modified clocked inverter 108 of FIG. 5.

Figure 5:
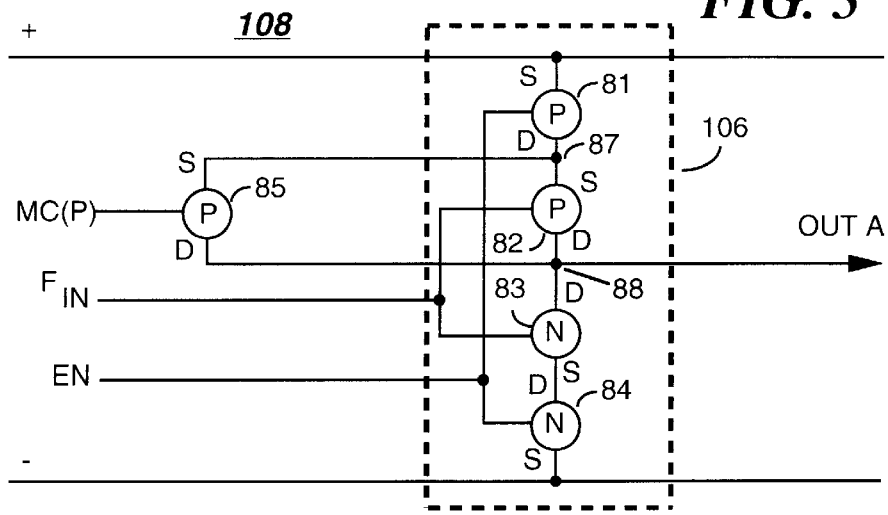
FIG. 5 is a schematic diagram of a modified clocked inverter used in a prescaler circuit in accordance with the present invention.

The modified clocked inverter 108 shown in FIG. 5 in accordance with the present invention removes a device from the "EN" terminal. In particular with the gated clocked inverter 107 of FIG. 4, P channel device 86 was removed. Preferably, the modified clocked inverter 108 in accordance with the present invention has a first P channel device 81 having a source coupled to a positive voltage signal and a drain coupled to a source of a second P channel device 82 forming a first junction 87. The modified clocked inverter 108 preferably further has a first N channel device 83 having a drain coupled to a drain of the second P channel 82 device forming a second junction 88 and the first N channel device 83 further having a source coupled to a drain of a second N channel device 84, wherein a source of the second N channel device 84 is coupled to a ground signal. Additionally, the modified clocked inverter 108 comprises a third P channel device 85 having a source coupled to the first junction 87 and a drain coupled to the second junction 88 forming an output signal (OUTA). Preferably, a control signal (MC(P)) is provided to a gate input of the third P channel device 85, a frequency data input signal ($F_{IN}$) is provided to a gate input of the second P channel device 82 and a gate input of the first N channel device 83, and a clocked input signal (EN) is provided to a gate input of the first P channel device 81 and a gate input of the second N channel device 84. Ideally, the output signal provides a clocked input signal for a subsequent modified clocked inverter such as the modified clocked inverter 110 as will be more fully described with respect to FIG. 7.

Figure 6:
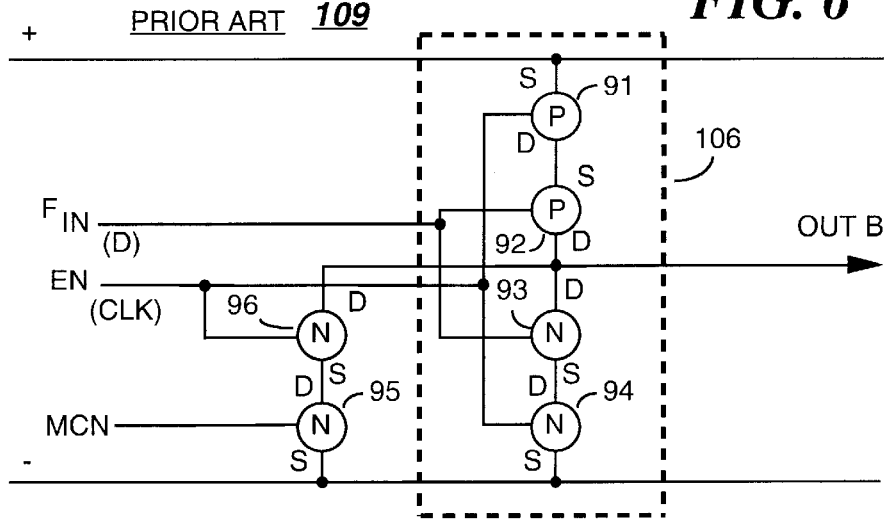
FIG. 6 is a schematic diagram of another existing gated clocked inverter used in a prescaler circuit.

Referring to FIG. 6, there is shown an existing gated clocked inverter 109 used in current prescaler circuits. Inverter 109 again has additional complexity and parasitic capacitance that limits the circuit from operating at a maximum frequency. Gated clocked inverter 109 is gated by the "MCN" signal through N channel devices 95 and 96. N channel device 96 has its gate connected to the line "EN" which would preferably be driven by a previous stage such as a modified clocked inverter like device 108 of FIG. 5. The loading that the inverter 109 presents to the previous stage is a limiting factor to the maximum operating frequency of the prescaler. Further details of the inverter 109 with the interconnections between P channel devices 91 and 92 and N channel devices 93 and 94 shall become apparent from the description below of the modified clocked inverter 110 of FIG. 7.

Figure 7:
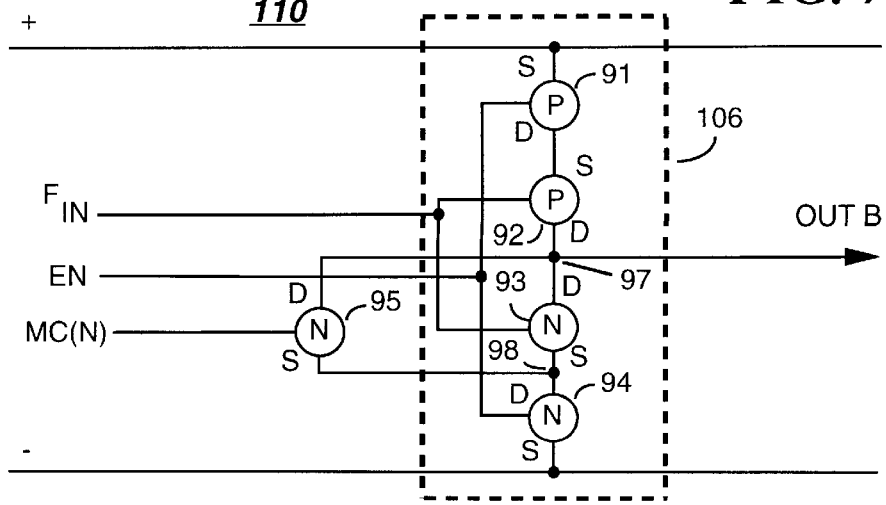
FIG. 7 is a schematic diagram of another modified clocked inverter used in a prescaler circuit in accordance with the present invention.

The modified gated clocked inverter 110 shown in FIG. 7 removes a device from the "EN" terminal. In particular with inverter 109 of FIG. 6, N channel device 96 was removed. Preferably, the improved gated clocked inverter 110 in accordance with the present invention has a first P channel device 91 having a drain coupled to a source of a second P channel device 92, wherein a positive voltage signal is coupled to a source of the first P channel device. Additionally, the inverter 110 preferably comprises a first N channel device 93 having a drain coupled to a drain of the second P channel device 92 forming a first junction 97 and the first N channel device 93 further having a source coupled to a drain of a second N channel device 94 forming a second junction 98, wherein a source of the second N channel device 94 is coupled to a ground signal. The modified clocked inverter 110 further comprises a third N channel device 95 having a drain coupled to the first junction 97 forming an output signal and a source coupled to the second junction 98 and a gate output coupled to the ground signal. Preferably, a control signal (MC(N)) is provided to a gate input of the third N channel device 95, a frequency data input signal ($F_{IN}$) is provided to a gate input of the second P channel device 92 and a gate input of the first N channel device 93, and a clocked input signal (EN or OUTA) is provided to a gate input of the first P channel device 91 and a gate input of the second N channel device 94. Preferably, the output signal (OUTB) of the modified clocked inverter 110 provides a feedback signal to a clocked inverter as shown in FIG. 2 where the feedback signal is provided to the clocked inverter 106.

A modified clocked inverter in a prescaler circuit as shown in either FIG. 5 or FIG. 7 essentially comprises a basic dynamic clocked inverter (106) having a pair of P channel devices and a pair of N channel devices coupled in series along with a device of a given polarity having a drain coupled to an output of the basic dynamic clocked inverter and a source coupled to a junction of a source and a drain of one of the pairs of P channel devices or N channel devices having the same polarity of the given polarity.

Figure 8:
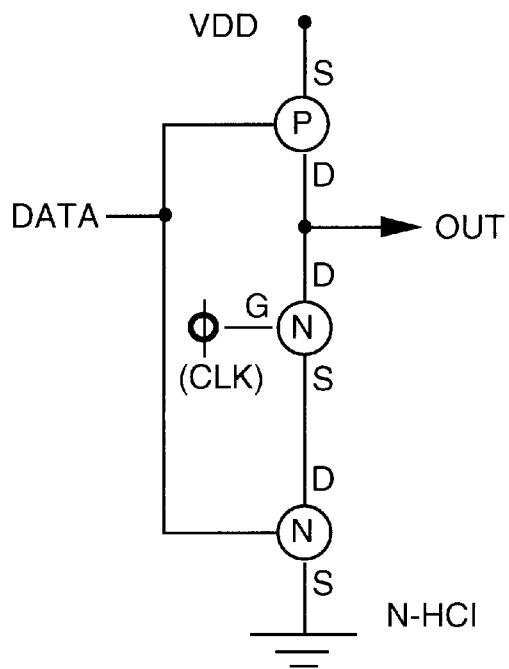
FIG. 8 is a schematic diagram of a n-half clocked inverter (N-HCI).
Figure 9:
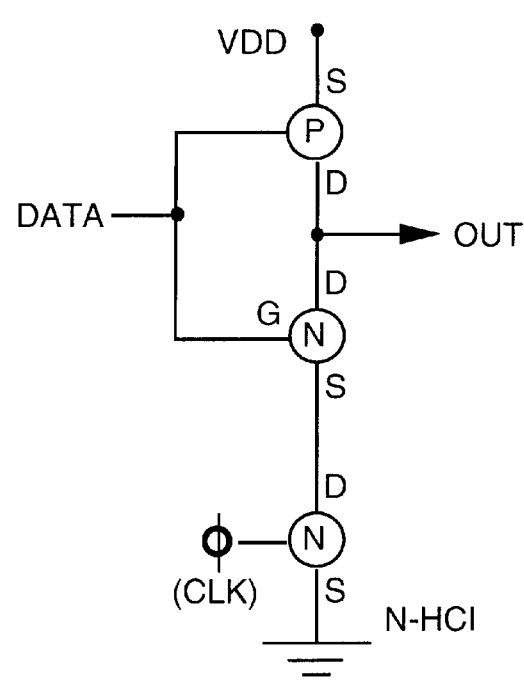
FIG. 9 is a schematic diagram of the n-half clocked inverter of FIG. 8 with interchanged inputs.
Figure 10:
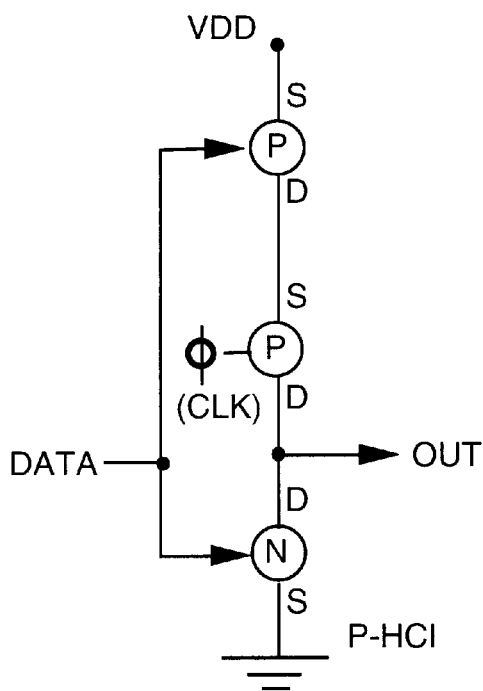
FIG. 10 is a schematic diagram of p-half clocked inverter (P-HCI) with interchanged p and n channel devices.
Figure 11:
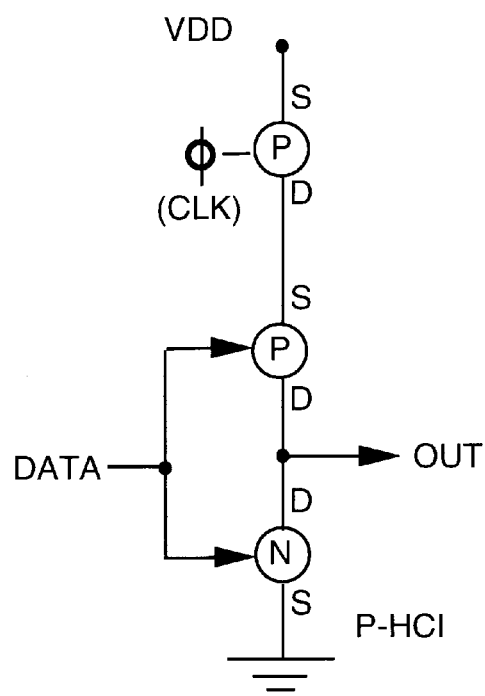
FIG. 11 is a schematic diagram of the p-half clocked inverter of FIG. 10 with interchanged inputs.

Dynamic CMOS circuits may be constructed from combinations of clocked inverters which may have various configurations. FIGS. 4, 6, and 8–11 show various implementations of clocked inverters (106). Configurations in the dashed boxes of FIGS. 4 and 6 are basic dynamic clocked inverters. The difference between the basic dynamic clocked inverters of FIG. 4 and FIG. 6 is the interchange of inputs. The output of all the illustrated clocked inverters is found at the junction of the p-channel and n-channel devices. The configuration of FIG. 8 is known as an n-block or n-half clocked inverter (NHCI). The same is true for the configuration shown in FIG. 9. The difference between these two implementations is that the CLK and DATA inputs have been exchanged. The interchange of inputs represents one dimension of symmetry that is inherent in the implementation of dynamic CMOS circuits. The configurations of FIGS. 10 and 11 are alternate implementations of the configurations of FIGS. 8 and 9 respectively. They are known as a p-block or p-half clocked inverter (PHCI). The interchange of n and p channel devices is a second dimension of symmetry that dynamic cmos circuits possess. The exchange of inputs and polarity of devices form two dimensions with which alternate implementations of one dynamic cmos circuit may be realized. This same concept of symmetric implementations are used to reveal the many alternate forms of the present invention that are contemplated within the scope of the claims.

Figure 12:
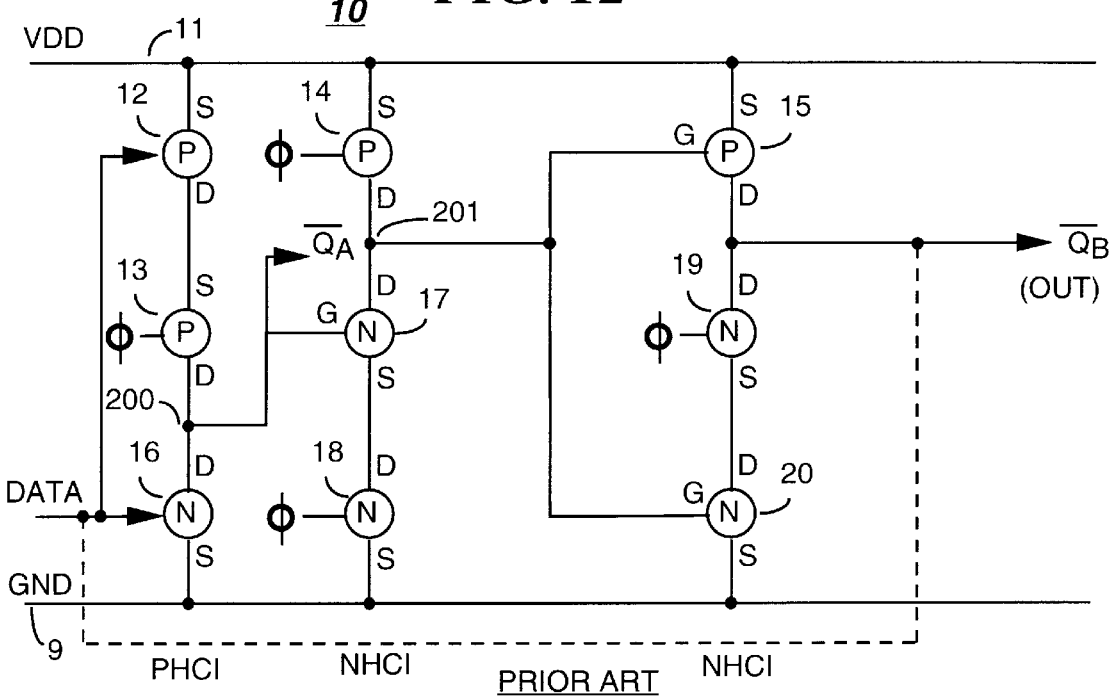
FIG. 12 is a schematic diagram of a true single phase clock (TSPC) nine-transistor D-flip-flop.
Figure 13:
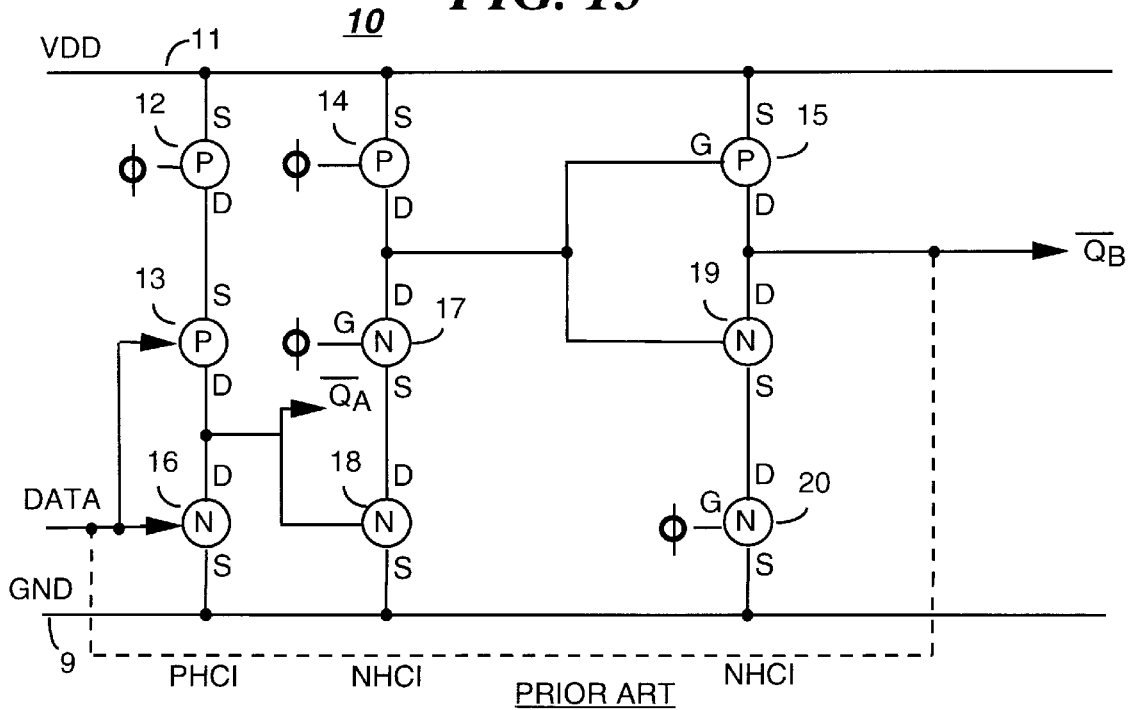
FIG. 13 is a schematic diagram of the TSPC nine-transistor D-flip-flop of FIG. 12 with interchanged inputs.

FIGS. 12 and 13 show well known alternative configurations for a Yuan-Svensson or True Single Phase Clock (TSPC) nine-transistor D-flip-flop. A typical example of a TSPC nine-transistor D-flip flop is shown in an article entitled *Speed Optimization of Edge-Triggered CMOS Circuits for Gigahertz Single-Phase Clocks,* by Qiuting Huang and Robert Rogenmoser (IEEE Journal of Solid-State Circuits, Vol. 31, No. 3, March 1996, pp456–465, see FIG. 1, p. 457) herein incorporated by reference.

FIGS. 12 and 13 demonstrate how the CLK input and the D (DATA) input of the TSPC flip flop may be interchanged to form alternate implementations of the same functional circuit. FIGS. 14 and 15 show a second implementation of the above circuits formed by interchanging NHCI and PHCI blocks for each other. Each of these configurations may be used to divide the input clock (CLK or ø (phi)) by two. In this use DN in FIGS. 14 and 15 (or $/Q_B$ in FIGS. 12 and 13) is connected to the DATA input. This configuration is illustrated by the dashed lines in FIGS. 12–15.

The TSPC flip flop 10 of FIGS. 12 and 13 has four P channel devices and five N channel devices whereas the TSPC flip flop 19 of FIGS. 14 and 15 have four N channel devices and five P channel devices. N and P channel devices 12–20 of TSPC flip flop 10 are coupled to each other, to a positive voltage signal 11, to a ground signal 9, to clock sources and to data sources as shown in FIGS. 12 and 13. Likewise, N and P channel devices 12, 14–16, 18, and 20–23 of TSPC flip flop 19 are coupled to each other, to a positive voltage signal 11, to a ground signal 9, to clock sources and to data sources as shown in FIGS. 14 and 15. These designs fail to divide by two or produce a usable output signal that will drive a subsequent stage under certain process and environmental conditions. The improved dynamic flip flop dividers 118 and 228 of FIGS. 16 and 17 respectively add two additional devices to eliminate the charge sharing/injection found in the existing designs of FIGS. 12–15 and further retains the high speed and low operating current of the dynamic flip flop. The interconnections of flip flops 10 and 19 of FIGS. 12, 13 and 14,15 respectively will become further apparent with the description below of the dividers 118 and 228 of FIGS. 16 and 17 respectively.

In a divide by two scenario, where DN (or $/Q_B$) is coupled to the DATA input as illustrated by the dashed line, the output, (OUT), of FIG. 12 is equal to CLK (or phi) divided by two. This same divide by two circuit may be implemented in three other forms. A second form is shown in FIG. 13, by interchanging the CLK and DATA input interconnect. A third and fourth implementation are realized by interchanging n-blocks and p-blocks and interconnecting as in FIGS. 14 and 15. The TSPC flip flop 10 of FIG. 12 operating as a divider (using the dashed line) and making reference to node 0 (n0) 200 and to node 1 (n1) 201, functions in the following manner: At t=0,CLK=0, n0=0 and n1=1, OUT=1. At t=1, CLK=1, n0 remains 0, n1 remains 1, OUT=0. At t=2 CLK=0, n0=1, n1 remains 1, OUT remains 0. At t=3, CLK=1, n0 remains 1, n1=0, OUT=1. At t=4, CLK=0, n0=0, n1=1, OUT remains 1 (same state as t=0). After two rising edges and two falling edges, two cycles; the output (OUT) has had one rising and falling edge, one cycle. Below is a chart summarizing the operating states of dynamic divide by two circuit:

| CLK | n0 | n1 | OUT |
|-----|----|----|-----|
| 0   | 0  | 1  | 1   |
| 1   | 0  | 1  | 0   |
| 0   | 1  | 1  | 0   |
| 1   | 1  | 0  | 1   |

The operation of this circuit in itself is adequate for some applications. The circuit does exhibit failings due to charge injection of the clock signal. As the CLK rises and falls, parasitic capacitance of the CMOS devices couples charge onto nodes n0 and n1 (200 and 201). This charge causes nodes n0 and n1 to assume potentials that are neither a logic 0 nor a logic 1. Charge is coupled into node n0 which causes a logic level that is 20 to 40% higher in potential than a logic 0. This affects the value of node n1. This combined affect is most prevalent in the output node. The charge injection causes the output node to reach values that are 55 to 75% of a logic one. This causes errors in the following stages. This problem is aggravated by process and temperature variations which the present invention solves.

FIG. 16 shows the TSPC flip flop with devices 41 and 42 added. These devices conduct during instances of charge injection. Device 41 is controlled by node n2 (302) and device 42 is controlled by node n0 (300). The improved flip flop 118 may have alternate implementations. These are created through the interchange of n-blocks and p-blocks. New configurations may also be created by changing the device to which the clock is connected. FIG. 17 is an alternate implementation created by interchanging n and p-blocks. Device 41 is controlled by node 302. This device maintains node 301 at a logic one level during periods of charge injection. Device 42 is controlled by node n3 (303). Device 42 maintains OUT (/$Q_B$) at a logic 0 under conditions of charge injection.

Referring to FIG. 16, an improved dynamic flip flop divider 118 preferably comprises a TSPC nine-transistor D-flip-flop having four P channel devices (32, 33, 34, and 35) and five N channel devices (36, 37, 38, 39, and 40), wherein the junction of a drain of one of the P channel devices (33) with a drain of one of the N channel devices (36) forms an output signal (/$Q_A$). The improved dynamic flip flop divider 118 further comprises a tenth transistor comprising an N channel device 41 having a source coupled to a ground level signal 43, a drain coupled to a junction between a drain of a P channel device (34) and a drain of another N channel device (37) of the TSPC nine-transistor D-flip-flop, the junction providing respective gate input signals to a P channel device 35 and an N channel device 40 and the tenth transistor 41 further having a gate coupled to a junction between a drain of yet another N channel device 39 and a source of yet another N channel device 40 of the TSPC nine-transistor D-flip-flop. The improved dynamic flip flop divider 118 further comprises an eleventh transistor comprising an N channel device 42 having a source coupled to the ground level signal 43 and a drain coupled to a junction between the drain of one of the P channel devices (35) and the drain of one of the N channel devices (39), the junction providing a feedback signal to the gate of one of the plurality of N channel devices (36), wherein the eleventh transistor (42)) further has a gate coupled to the output signal (/$Q_A$) of the TSPC nine-transistor D-flip-flop. A more detailed description of the interconnections of the N and P channel devices follows below.

Again, referring to FIG. 16, the improved dynamic flip flop divider 118 comprises a plurality of N and P channel devices coupled together, wherein each of the channel devices have a source, a drain, and a gate and wherein a P channel device 32 has its drain coupled to the source of another P channel device 33 and at least two N channel devices (37 and 39) have their respective sources coupled to the respective drains of another at least two N channel devices (38 and 40) and at least three of the plurality of P channel devices (33, 34, and 35) have their respective drains coupled to the drain of each of at least three of the plurality of N channel devices (36, 37, 39). The improved dynamic flip flop divider 118 further preferably has at least two N channel gate inputs provided by the junction of the drains of one of the plurality of P channel devices (33) with the drains of one of the plurality of N channel devices (36). Additionally, there is at least one P channel gate input, one N channel input and one N channel drain input provided by the junction of the drain of a P channel device (34) with the drain of a N channel device (37). A positive voltage signal 31 preferably couples to the source of at least three of the plurality of P channel devices (32, 34, and 35) and the ground signal 43 couples to the source of at least five of the plurality of N channel devices (36, 38, 41, 40, and 42) and to the input gate of at least one of the at least five of the plurality of N channel devices (41). Preferably, a clock signal couples to the input gates of at least two of the plurality of N channel devices (38 and 39) and to the input gates of at least two of the plurality of P channel devices (33 and 34). A data feedback signal (/$Q_B$) preferably couples to the gate of at least one of the P channel devices (32). The divider 118 further comprises a first output signal formed from the junctions between the drain of one of the plurality of P channel devices (33) and the drain of one of the plurality of N channel devices (36) along with the junction of the gate of another one of the plurality of N channel devices (42). Preferably, this first output signal (/$Q_A$) drives a subsequent flip flop stage. A second output signal (/$Q_B$) is preferably formed from the junctions of at least two of the drains of the plurality of the N channel devices (39 and 42) with the drain of at least one of the plurality of P channel devices (35) wherein the second output signal provides a feedback signal to the gate of another one of the plurality of N channel devices (36). Preferably, the second output signal drives a multiplexer.

Referring to FIG. 17, in an alternative embodiment, an improved dynamic flip flop divider 228 preferably comprises a TSPC nine-transistor D-flip-flop having five P channel devices (32, 34, 35, 45 and 46) and four N channel devices (44, 36, 38, and 40), wherein the P channel device 33, the N channel device 37 and the N channel device 39 of FIG. 16 has been respectively replaced by the N channel device 44, the P channel device 45 and the P channel device 46 in the divider 228 of FIG. 17. Additionally, the divider 228 comprises a tenth transistor comprising a P channel device 49 having a gate input and a source coupled to a positive voltage signal 31, a drain coupled to a junction between a drain of the P channel device 45 and a drain of another N channel device 38 of the TSPC nine-transistor D-flip-flop and further having an gate output coupled to a junction between a drain of yet another P channel device 35 and a source of yet another P channel device 46 of the TSPC nine-transistor D-flip-flop. The divider further comprises an eleventh transistor comprising a N channel device 48 having a gate input provided by the junction of a source of the N channel device 44 and a drain of the P channel device 36, the eleventh transistor further having a gate output and a source coupled to a ground level signal 43 and a drain coupled to an output of the TSPC nine-transistor D-flip-flop which forms a feedback signal to a gate of one of the N channel devices (36) of the TSPC nine-transistor D-flip-flop. A more detailed description of the interconnections of the N and P channel devices of the divider 228 in FIG. 17 follows below.

Again, referring to FIG. 17, the improved dynamic flip flop divider 228 comprises a plurality of N and P channel devices coupled together, wherein each of the channel devices have a source, a drain, and a gate and wherein at least three of the plurality of P channel devices (32, 45 and 46) have their respective drains coupled to the drains of at least three of the plurality of N channel devices (44, 38 and 40) and wherein at least another two of the plurality of P channel devices (34 and 35) have their respective drains coupled to the sources of at least two of the at least three of the plurality of P channel devices (45 and 46). The improved dynamic flip flop divider 228 preferably has a gate input signal for both one of the plurality of P channel devices (35) and one of the plurality of N channel devices (40) formed from the junction of the respective drains of at least two of the plurality of P channel devices (45 and 49) and the drain of one of the plurality of N channel devices (38). The divider 228 also has a gate input signal for one of the plurality of N channel devices (48) formed from the junction of the source of one of the plurality of N channel devices (44) with the drain of one of the plurality of N channel devices (36). The positive voltage signal 31 couples to the source of at least four of the plurality of P channel devices (32, 34, 49, and 35). The ground signal 43 couples to the source of at least four of the plurality of N channel devices (36, 38, 48, and 40). A clock signal couples to the input gates of at least two of the plurality of N channel devices (44 and 38) and to the input gates of at least two of the plurality of P channel devices (34 and 46). Additionally, a data feedback signal (/$Q_B$) couples to the gate of at least one of the P channel devices 32. Preferably, a first output signal (/$Q_A$) is formed from the junction between an input gate to one of the plurality of P channel devices 45, the drain of one of the plurality of P channel devices 32 and the drain of one of the N channel devices 44. A second output signal (/$Q_B$) is formed from the junction of the respective drains of at least two of the plurality of N channel devices (48 and 40) along with the drain of at least one of the plurality of P channel devices (46) wherein the second output signal provides a feedback signal to the gate of one of the plurality of N channel devices (36).

The added devices (41 and 42 in the case of divider 118 of FIG. 16 and devices 48 and 49 in the case of divider 228 of FIG. 17) to the standard TSPC flip flop configurations permit the operation of a very fast CMOS dynamic flip flop with signals that have very slow rise and fall times. As an example, the TSPC flip flop 19 of FIG. 14 operates in the divide by two mode to over 1 gigahertz. The clock signal that the flip flop divides must have a rise and fall time of less than 400 ps to maintain proper divide by two operation. This places limitations upon the drive circuits that clock the flip flop. The clock drivers must switch quickly and consume relatively large currents to drive an integrated circuit having the flip flop. The clock drivers also consume relatively large areas on an integrated circuit carrying the flip flop.

An improved flip flop as shown in FIG. 17 would operate properly with a clock rise and fall time of 1200 ps. This greatly reduces the clock drive circuitry for smaller die area and lower current drain. Referring to FIG. 17 in further detail, nodes A (400), B (401), and /Q (402) are storage nodes. They are similar to memory locations in which a logic one or a logic zero are stored. Nodes 400 and 401 are switched from one logic level to another by their N and P channel CMOS devices. As in node 402, P channel device 32 switches node 400 from a logic 0 to a logic 1. N channel devices 44 and 36 are required to switch node 400 from a logic 1 to a logic 0. If there were no parasitic capacitances attached to nodes 400, 401, or 402, then the operation of this dynamic flip flop would not be so sensitive to rise and fall times of the clock waveform. It is the parasitic capacitance from the gate to the drain of the previously mentioned N and P channel devices (32, 44, and 36) that change the voltage on node 402 to values that are neither a logic one or a logic zero. This causes the flip flop to fail to divide by two.

As an example, as the clock (phi or Ø) changes to a logic one, charge flows through the gate to drain capacitance of N channel device 44. This charge increases the potential at node 402. The logic one on the clock input is supposed to pull node 402 to logic zero, if node 400 (/$Q_B$) is a logic one. Due to the nature of dynamic logic node 400 (/$Q_B$) and the clock input are a logic one for only a few tens of picoseconds. So, the node 402 is pulled to a logic zero for only a few tens of picoseconds. The charge that is injected onto node 402 via the gate to drain parasitic capacitance of N channel device 44 is sufficiently large to raise the potential of node 402 from logic zero to approximately 250 mV. This is with conditions of 600 ps. rise and fall times on the clock waveform. If the rise and fall times of the clock waveform are less than 400 ps., then, node 402 remains a valid logic zero.

Adding N channel device 48 to node 400 prevents the parasitic gate to drain capacitance of P channel device 46 from perturbing node 400. The added device allows for the maintenance of a logic zero on a storage node during the time of parasitic charge injection into the storage node.

The above description is intended by way of example only and is not intended to limit the present invention in any way except as set forth in the following claims. For example, it should be understood that use of devices other than CMOS yet exhibiting similar characteristics such as gallium arsenide MESFETS are contemplated to be within the scope of the claimed invention when arranged in accordance with the present invention.

What is claimed is:

1. An improved dynamic flip flop divider, comprising:
   a PHCI, a first NHCI, and a second NHCI wherein the output of the PHCI is coupled to a first n-channel gate input of the first NHCI;
   an output of the first NCHI is coupled to a first n-channel gate input and a p-channel gate input of the second NHCI;
   an output of the second NHCI is coupled to a first p-channel gate input and an n-channel gate input of the PHCI;
   a clock signal coupled to a second p-channel gate input of the PHCI, and to a second n-channel gate input and a p-channel gate input of the first NHCI, and to a first n-channel gate input of the second NHCI;

a first additional n-channel device having a source coupled to a ground supply, a drain to the output of the first NHCI, and a gate coupled to a junction between n-channel devices in the second NHCI; and a second additional n-channel device having a source coupled to the ground supply, a drain coupled to the output of the second NHCI, and a gate coupled to the output of the PHCI.

2. The improved dynamic flip flop divider according to claim 1 wherein the output of the PHCI is coupled to an input of a second divider.

3. The improved dynamic flip flop divider according to claim 1 wherein the output of the second NHCI is coupled to a multiplexer.

4. An improved cmos dynamic flip flop divider, comprising:

a nhci block, a first phci block, and a second phci block wherein the output of the nhci block is coupled to a first p-channel gate input of the first phci block;

an output of the first phci block is coupled to a first p-channel gate input and a n-channel gate input of the second phci block;

an output of the second phci block is coupled to a first n-channel gate input and the p-channel gate input of the nhci block;

a clock signal coupled to a second n-channel gate input of the nhci block, and to a second p-channel gate input and a n-channel gate input of the first phci block, and to a first p-channel gate input of the second phci block;

an additional n-channel device having a source coupled to a ground supply, a drain to the output of the second phci block, and a gate coupled to the output of the nhci block; and an additional p-channel device having a source coupled to the positive supply, a drain coupled to the output of the first phci block, and a gate coupled to a junction between p-channel devices in the second phci block.

5. The improved dynamic flip flop divider according to claim 4 wherein the output of the nhci block is coupled to an input of a second divider.

6. The improved dynamic flip flop divider according to claim 4 wherein the output of the second phci block is coupled to a multiplexer.

* * * * *